United States Patent

Swanson

[15] 3,643,161

[45] Feb. 15, 1972

[54] PULSE DURATION MODULATION TRANSMITTER

[72] Inventor: Hilmer I. Swanson, Quincy, Ill.

[73] Assignee: Gates Radio Company, Quincy, Ill.

[22] Filed: Dec. 13, 1967

[21] Appl. No.: 690,167

[52] U.S. Cl. ..............................325/150, 325/142, 325/151, 325/152, 328/259, 330/51, 330/140, 330/200, 332/11

[51] Int. Cl. ..........................................................H04b 1/02

[58] Field of Search..................325/133, 141, 142, 150, 151, 325/152, 159, 161, 166, 169; 332/59, 60, 61, 63, 9–11; 328/259; 330/51, 70, 74, 138, 139, 140, 141, 192, 200; 323/22, 32, 65, 66

[56] References Cited

UNITED STATES PATENTS

| | | | |
|---|---|---|---|
| 2,163,670 | 6/1939 | Ditcham | 332/61 |
| 2,970,282 | 1/1961 | Hofer et al. | 332/61 |
| 3,365,675 | 1/1968 | Caddy et al. | 325/152 |
| 3,366,883 | 1/1968 | Griffin et al. | 325/150 |

*Primary Examiner*—Robert L. Griffin
*Assistant Examiner*—Albert J. Mayer
*Attorney*—Hill, Sherman, Meroni, Gross & Simpson

[57] ABSTRACT

A radiofrequency transmitter having a pulse duration low-level modulator, a threshold amplifier, a power amplifier and a radiofrequency modulator. The power amplifier and the radiofrequency modulator are connected in series and means are provided to control the power level of the power amplifier and RF modulator by controlling the input signal to the threshold amplifier. Specifically, the plate of the power amplifier is protected by sensing the output RF power, by sensing the input power to the transmitter, by comparing the two and by triggering an electronic switch to short circuit the input to the threshold amplifier when the difference between the output and input powers exceeds a desired level. Similarly, a VSWR sensor is utilized to sense the voltage standing wave ratio of the transmitter, and a threshold trigger circuit is employed to be responsive to the VSWR sensor for substantially short circuiting the input to the threshold amplifier, thereby reducing the power to the output stages. In a similar manner, an arc sensor is employed in combination with an SCR circuit to short the input to the threshold amplifier in the presence of an unwanted detected arc. Also, the high-frequency carrier signal is controlled by a negative feedback circuit which responds to an excessive carrier level by reducing the input power to the threshold amplifier.

15 Claims, 8 Drawing Figures

INVENTOR.
Hilmer I. Swanson
BY Hill, Sherman, Meroni, Gross & Simpson ATTORNEYS

INVENTOR.

Hilmer I. Swanson

BY Hill, Sherman, Meroni, Gross & Simpson ATTORNEYS

INVENTOR.

Hilmer I. Swanson

BY Hill, Sherman, Meroni, Gross & Simpson ATTORNEYS

INVENTOR

Hilmer I. Swanson

BY Hill, Sherman, Meroni, Gross & Simpson ATTORNEYS

INVENTOR.
Hilmer I. Swanson

BY

ATTORNEYS

PULSE DURATION MODULATION TRANSMITTER

BACKGROUND OF THE INVENTION

1. Field of the Invention

The field of art to which this invention pertains is a radiofrequency transmitter and, in particular, to a high-power transmitter employing protective devices to prevent the overloading of the output stages of the amplifier and to prevent excessive dissipation in the output circuit.

SUMMARY

It is an important feature of the present invention to provide an improved high-power radiofrequency transmitter.

It is also an important feature of the present invention to provide a radiofrequency transmitter having improved means for controlling the power level of the high-power output stages.

It is an important object of the present invention to provide a high-power radiofrequency transmitter having improved means for sensing an unwanted circuit condition and for adjusting the power level to the output stages thereof, accordingly.

It is also an object of this invention to provide an improved means for sensing the power dissipation of a high-power radiofrequency transmitter and for developing a control signal to reduce the power at the power output stages thereby protecting the circuit from overload conditions.

It is another object of this invention to provide a high-power radiofrequency transmitter having a power amplifier stage and a radiofrequency modulator connected in series and having means for controlling the power delivered to the output stages which means are coupled to the low-level threshold amplifier stages of the transmitter.

It is a further object of this invention to provide a means for sensing the output power of a high-power radiofrequency transmitter, means for sensing the input power of the transmitter and means for responding to a given power dissipation as reflected by the difference between the input and output powers to control the power delivered to the power amplifier and radiofrequency modulator stages.

It is an additional object of this invention to provide a radiofrequency high-power transmitter of the type described above wherein means are provided for substantially short circuiting the input of a low-level amplifier transistor in response to the sensing of an unwanted circuit condition.

It is a further object of this invention to provide a means for sensing the presence of an unwanted arc in the power amplifier or damper tubes of a high-power radiofrequency transmitter and to provide an electronic switching device responsive to the presence of a sensed art for substantially short circuiting the input to a threshold low-level amplifier wherein the power amplifier and radiofrequency modulator are coupled in series.

It is also an object of this invention to provide a means for coupling a signal which is indicative of the level of the radiofrequency carrier signal to the input of a low level threshold amplifier for controlling the output level of the carrier signal by means of a feedback loop which is connected through the series combination of the power amplifier and radio frequency modulator stages of the transmitter.

These and other objects, features and advantages of the present invention will be understood in greater detail from the following description and the associated drawings wherein reference numerals are utilized to designate an illustrative embodiment.

DESCRIPTION OF THE PREFERRED EMBODIMENT

Figure 1:
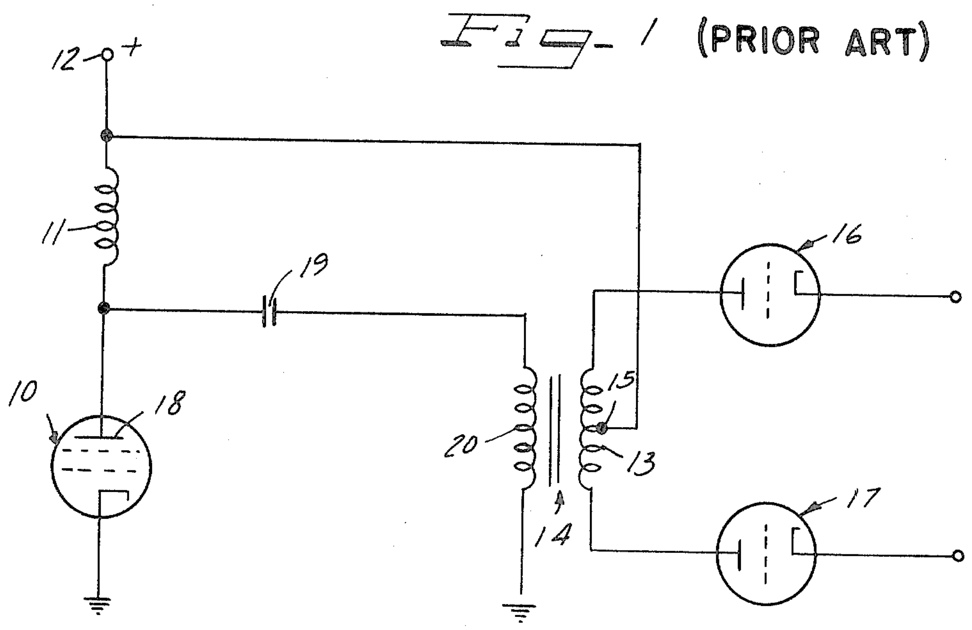
Fig. 1 (PRIOR ART)
FIG. 1 is a partial schematic of a prior art form of high-power radiofrequency transmitter wherein the power amplifier tube and the radiofrequency modulator stage are coupled in parallel.

FIG. 1 shows a prior art form of connection for the power amplifier and radiofrequency modulators. In particular, a power amplifier 10 is coupled through a choke 11 to a B+ supply at a connection 12. The B+ supply also feeds the secondary winding 13 of a transformer 14. The B+ supply is connected at a center tap 15, and a pair of modulator tubes 16 and 17 are connected in push-pull manner as is well understood.

The output from the plate 18 of the power amplifier tube 10 is coupled through a capacitor 19 to the primary winding 20 of the transformer 14. The capacitor 19 and primary winding 20 couple the high-level audio signal to the radiofrequency modulator stage in such a manner that the radiofrequency modulator is in parallel with the power amplifier tube with respect to the B+ supply. Accordingly, the turning "off" of the power amplifier tube 10 does not turn "off" the radiofrequency modulator, and hence, for instance, excessive dissipation at the plate 18 could not be prevented by decreasing the input signal to the power amplifier tube 10.

Figure 2:
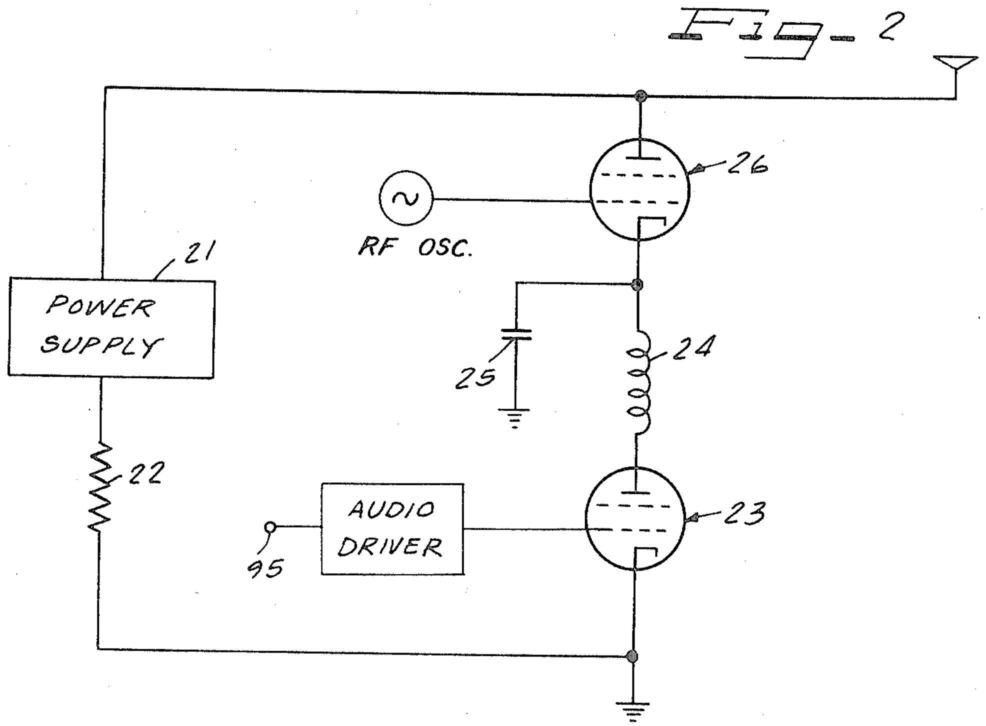
FIG. 2 is a partial schematic showing the power amplifier and the radiofrequency modulator tubes connected in series in accordance with the present invention.

In contrast, the present invention, a simplified schematic of which is shown in FIG. 2, includes a power supply 21, a load 22 and a series circuit which includes a power amplifier 23, a filter consisting of a coil 24, and a capacitor 25 and a radiofrequency modulator 26. Since the same current flows through the power amplifier and radiofrequency modulator, the turning "off" of the power amplifier 23 will turn "off" the radiofrequency modulator, and, accordingly, control of the entire power output stage is possible at any point in the transmitter circuit which feeds the power amplifier tube.

Figure 3:
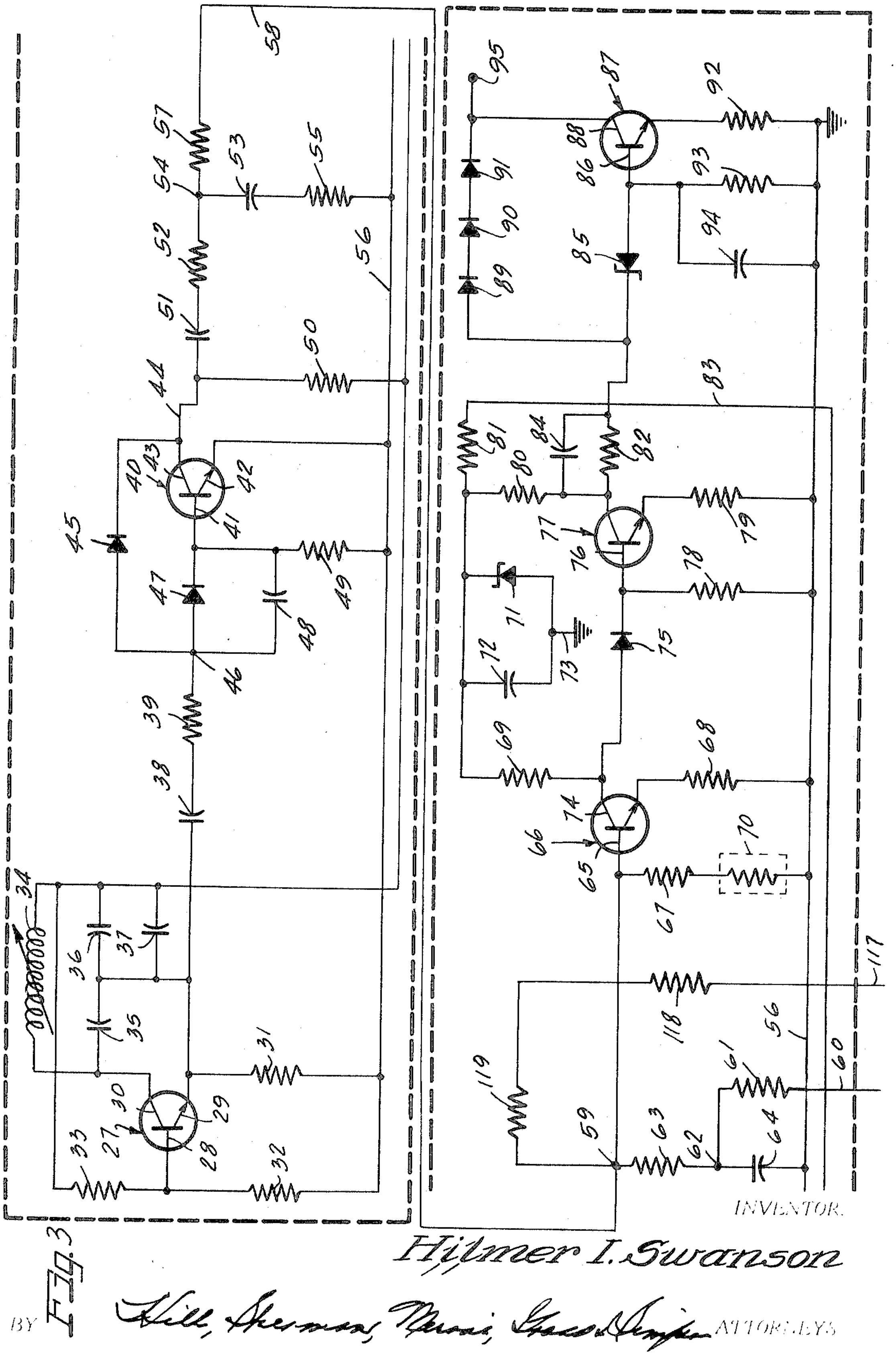
FIG. 3 is a schematic of a modulator and low-level amplifier circuit according to the present invention.

Referring specifically to the low-level amplifier and modulator as shown in FIG. 3, a low-level oscillator comprises a transistor 27 having a base 28, an emitter 29 and a collector 30. Bias for the transistor 27 is established by means of a series of resistors 31, 32 and 33. The oscillator circuit includes an adjustable coil 34 and three capacitors, namely, capacitors 35, 36 and 37. The circuit is tuned to approximately 70 kilocycles in a well-understood manner, and the output sine wave which appears at the emitter 29 is coupled by means of a capacitor 38 and a resistor 39 to a clipper stage.

The clipper stage includes a transistor 40 having a base 41, an emitter 42 and a collector 43. The clipping action is provided by driving the transistor 40 beyond saturation to develop a substantially square wave signal at the collector 44.

A diode 45 is coupled between the collector 44 and a circuit junction point 46 which in turn is coupled through a second diode 47 to the base 41 of the transistor 40. The diode 45 provides negative feedback from the collector to the base when the collector drops to a low voltage level. The diode 47 is provided to balance off the essentially 1-volt drop provided by the diode 45 and hence maintain the voltage levels of the base and collector at substantially the same magnitude. A capacitor 48 is connected across the diode 47 to bypass the AC signal. Bias for the transistor 43 is established by means of resistors 49 and 50 as shown.

The square wave signal which is developed at the collector 44 is coupled by means of a capacitor 51 to an integrating circuit which includes a resistor 52 and a capacitor 53. At this point, the square wave is integrated to form a triangular-shaped waveform at a circuit junction point 54.

A further resistor 55 is connected between the capacitor 53 and a common supply line 56. The resistor 55 adds a square wave signal to the triangular signal and develops a spiked configuration at the peak of the triangular waveform to improve the modulation efficiency of the signal in accordance with the provision of my copending patent application Ser. No. 526,444, filed Feb. 10, 1966 now U.S. Pat. No. 3,440,566.

The modified or spiked triangular signal is then coupled through a resistor 57 by means of a line 58 to a circuit junction point 59.

The audio signal is coupled in a well-understood manner from a line 60 through a resistor 61 to a circuit junction point 62 and hence through a resistor 63 to the circuit junction point 59. Accordingly, the audio and spiked triangular modulation signals are combined at the circuit junction point 59. A blocking capacitor 64 is coupled between the circuit junction point 62 and the common line 56.

The combined signal is then fed to a base 65 of a transistor 66 for modulating the audio information.

Bias for the transistor 66 is established by means of resistors 67, 68 and 69. The resistor 67 is connected between the base 65 and the common line 56. An additional temperature-sensitive resistor 70 is connected between the resistor 67 and the common line 56 to compensate for temperature effects on the transistor 66.

A voltage regulator which includes a zener diode 71 and a filter capacitor 72 is connected between the resistor 69 and ground at a terminal 73, the diode 71 and capacitor 72 being connected in parallel.

Accordingly, a pulse duration modulated signal appears at the collector 74 of the transistor 66 as described in my copending patent application U.S. Ser. No. 526,610, filed Feb. 10, 1966 now U.S. Pat. No. 3,506,920.

The modulated signal is then coupled through a diode 75 to a base 76 of a further amplifier transistor 77. Bias for the transistor 77 is provided by resistors 78, 79, 80, 81 and 82. A higher voltage signal being fed to the resistor 81 through a feed line 83. An AC to DC proportioning capacitor 84 is connected across the DC path which includes the resistor 82.

The output of the transistor 77 is coupled through a zener diode 85 to a base 86 of a further amplifier 87. Negative feedback from the collector 88 to the base 86 is provided by means of a series of diodes 89, 90 and 91 similar to the negative feedback provided in connection with the transistor 40. The zener diode compensates for the voltage drops across the diodes 89, 90 and 91 to assure that the collector and base of the transistor 87 are maintained at substantially the same voltage level. For instance, a 1-volt drop across each of the diodes 89, 90 and 91 may be compensated by a 3-volt zener diode 86. Bias for the transistor 87 is provided by resistors 92 and 93 and a capacitor 94 in a well understood manner. A higher voltage supply is coupled at a terminal 95 to the collector of the transistor 87.

The output of the transistor 87 is then coupled through an audio driver circuit to the power amplifier and through a series filter to the radiofrequency modulator as indicated generally in FIG. 2.

Figures 4, 5:
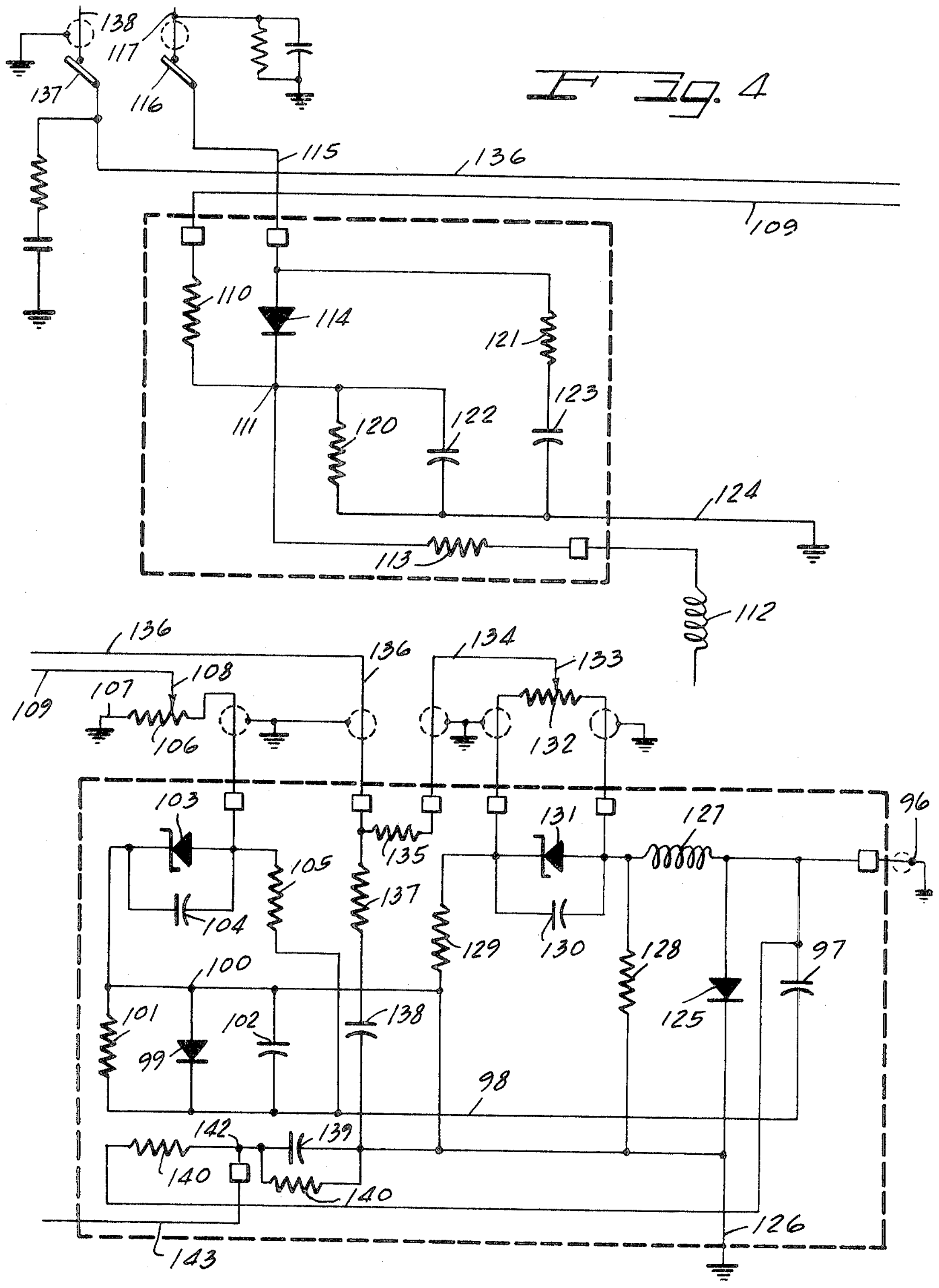
FIG. 4 is a schematic of a dissipation control circuit which develops a control signal for influencing the amplifier shown in FIG. 3 and hence controlling the power delivered to the power amplifier and radiofrequency modulator.
FIG. 5 is a schematic showing a feedback circuit.

The power amplifier plate protection circuit is shown in FIGS. 4 and 5 as consisting of a feedback arrangement of FIG. 5 and a dissipation control circuit as shown in FIG. 4.

Generally, the RF output signal is tapped and fed back to a circuit junction point 96. The RF signal is coupled through a capacitor 97 to a common circuit line 98. A detector 98 is coupled from a circuit junction point 100 to the common line 98 and is connected in parallel with a resistor 101 and a capacitor 102. The detector develops a DC signal from the RF input signal, and a zener diode 103, which is connected in parallel with a capacitor 104, limits the DC level to a given output such as 7.5 volts. The capacitor 104 is a smoothing capacitor. The anode of the diode 103 is coupled through a resistor 105 to the common line 98 as shown.

The DC output signal from the anode of the diode 103 is coupled through a resistor 106 to ground at a point 107 and a movable tap 108 is adjusted to calibrate the DC output signal.

The calibrated signal is fed from the tap 108 through a circuit line 109 to a resistor 110 (FIG. 4). Hence, the calibrated DC signal which is indicative of radiofrequency power arrives at a circuit junction point 111 which may be considered to be the mixing dissipation control point. A signal which is indicative of the input power to the transmitter is coupled through a coil 112 and a resistor 113 to the circuit junction point 111.

The DC signal arriving by means of the circuit line 109 is a positive-going signal, and the DC signal arriving through the resistor 113 is a negative-going signal. Hence, the two signals may be added algebraically at the junction point 101 and may be used to either turn "on" or turn "off" a diode 114 in accordance with which of the two signals predominates. For instance, if the negative signal from the input supply has an absolute value which is substantially greater than the signal arriving from the output RF stage, then the diode 114 will be turned "on" and will conduct through a line 115 and an open and close switch 116 to a line 117. The line 117 is then coupled directly to a resistor 118 (FIG. 3) and a second resistor 119 to the circuit junction point 59. The turning "on" of the diode 114 will then substantially short circuit the base 65 of the transistor 66 (also, FIG. 3) and hence cut off the amplification of the transistors 77 and 87.

The cutting off of the transistor 87 will then cut off the supply to the power amplifier tube 23 as shown in FIG. 2 and hence cut off the flow of power in the series circuit as described in connection with FIG. 2. Accordingly, the high-level power amplifier and RF modulator are controlled at a circuit point which is at a low voltage level, for instance, approximately one-half volt. It will be noted in connection with the description of FIG. 4 that a pair of resistors 120 and 121 and a pair of capacitors 122 and 123 are coupled from the cathode and anode of the diode 114 to ground at a circuit junction point 124. Hence the diode is protected from sudden voltage surges.

With further reference to FIG. 5, a further signal may be taken from the junction 96 which is indicative of the radiofrequency carrier level and rectified through a diode 125 to ground at 126. A smoothing and voltage limiting circuit consists of a coil 127, resistors 128 and 129 and a capacitor 130 which is connected in parallel with a zener diode 131, the zener diode limiting the voltage output across a resistor 132 similar to the case of the zener diode 103.

A movable tap 133 is coupled from the resistor 132 to calibrate the DC output at a line 134 and is fed through a further resistor 135 to a control line 136. The control line 136 may then be tapped through a resistor 137 and a pair of capacitors 138 and 139 along with a pair of resistors 140 and 141 to a circuit junction point 142 for supplying an efficiency meter or the like through a circuit line 143.

The calibrated DC signal which is indicative of the carrier level is then coupled through a switch 137 (FIG. 4) to a line 138 which is identical with the line 60 shown in FIG. 3 and which connects to a circuit junction point 62 and through a resistor 63 to a circuit junction point 59 which is identical with the base 65 of the transistor 66. Accordingly, since the signal applied through the line 138 is a negative feedback signal, increases in the carrier level above required levels will cause a reduction in the gain of the transistor 66 and hence control the power delivered to the power output stages. Accordingly, once again, the power to the output stages is controlled at a low level, approximately a one-half volt base connection to the transistor 66.

Figure 6:
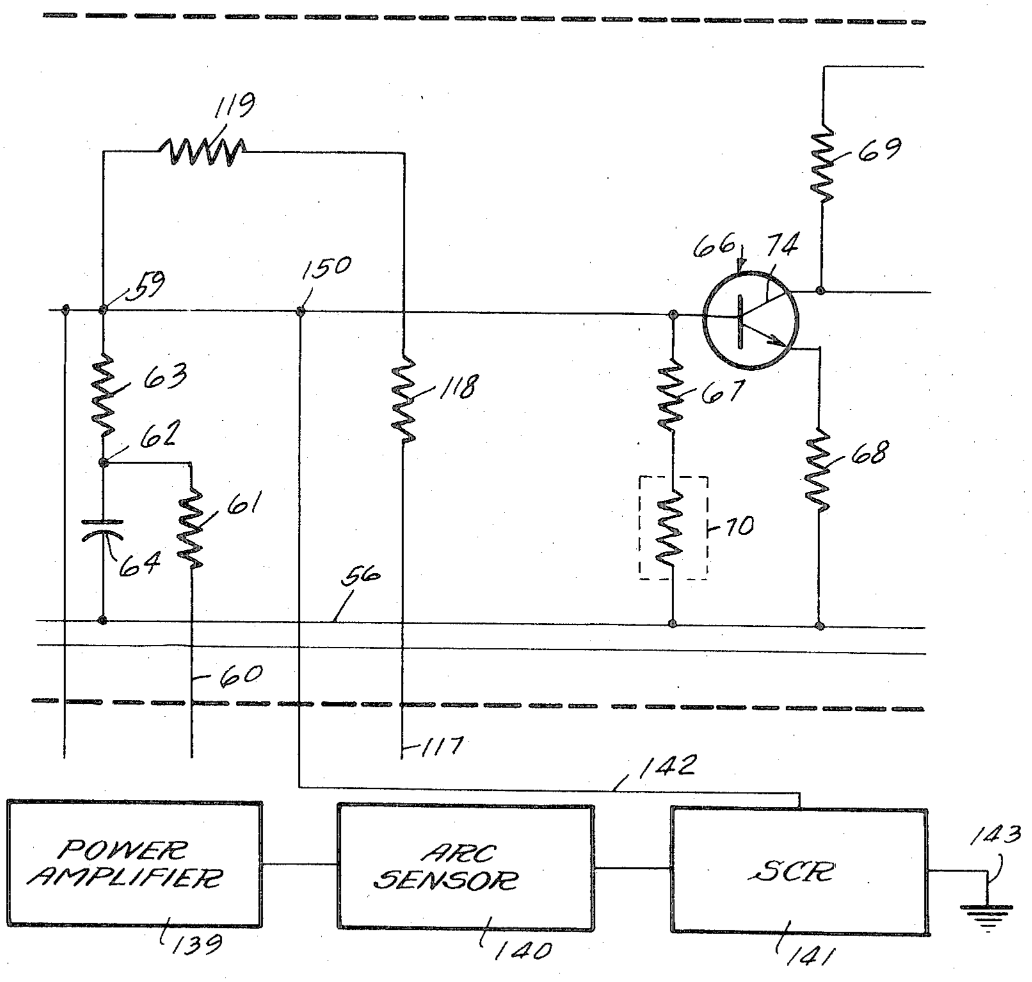
FIG. 6 is a schematic showing a portion of the schematic shown in FIG. 3 and illustrating diagrammatically the connection of a control circuit for regulating the operation of a threshold amplifier in accordance with a sensed power amplifier or damper tube arc.
Figure 7:
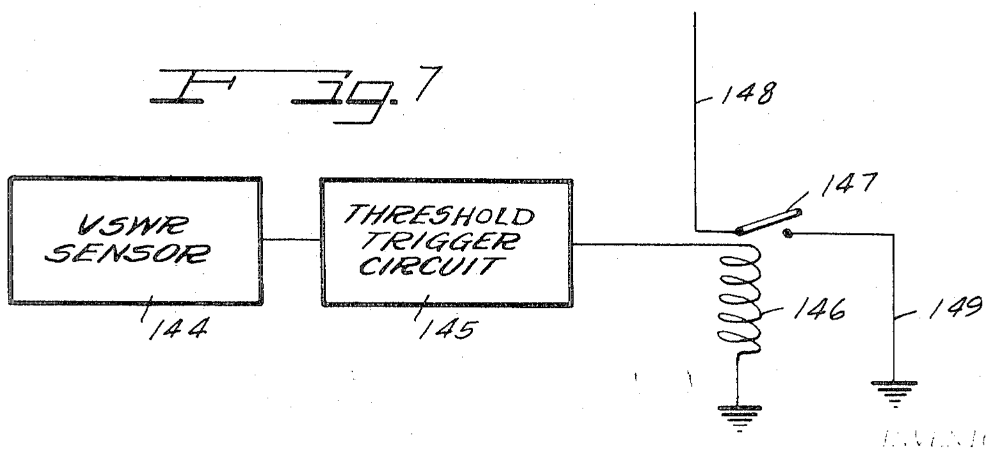
FIG. 7 is a diagrammatic view similar to that shown in FIG. 6 showing the use of a VSWR sensor to regulate the input power to the threshold amplifier and hence to the power amplifier and radiofrequency modulator.
Figure 8:
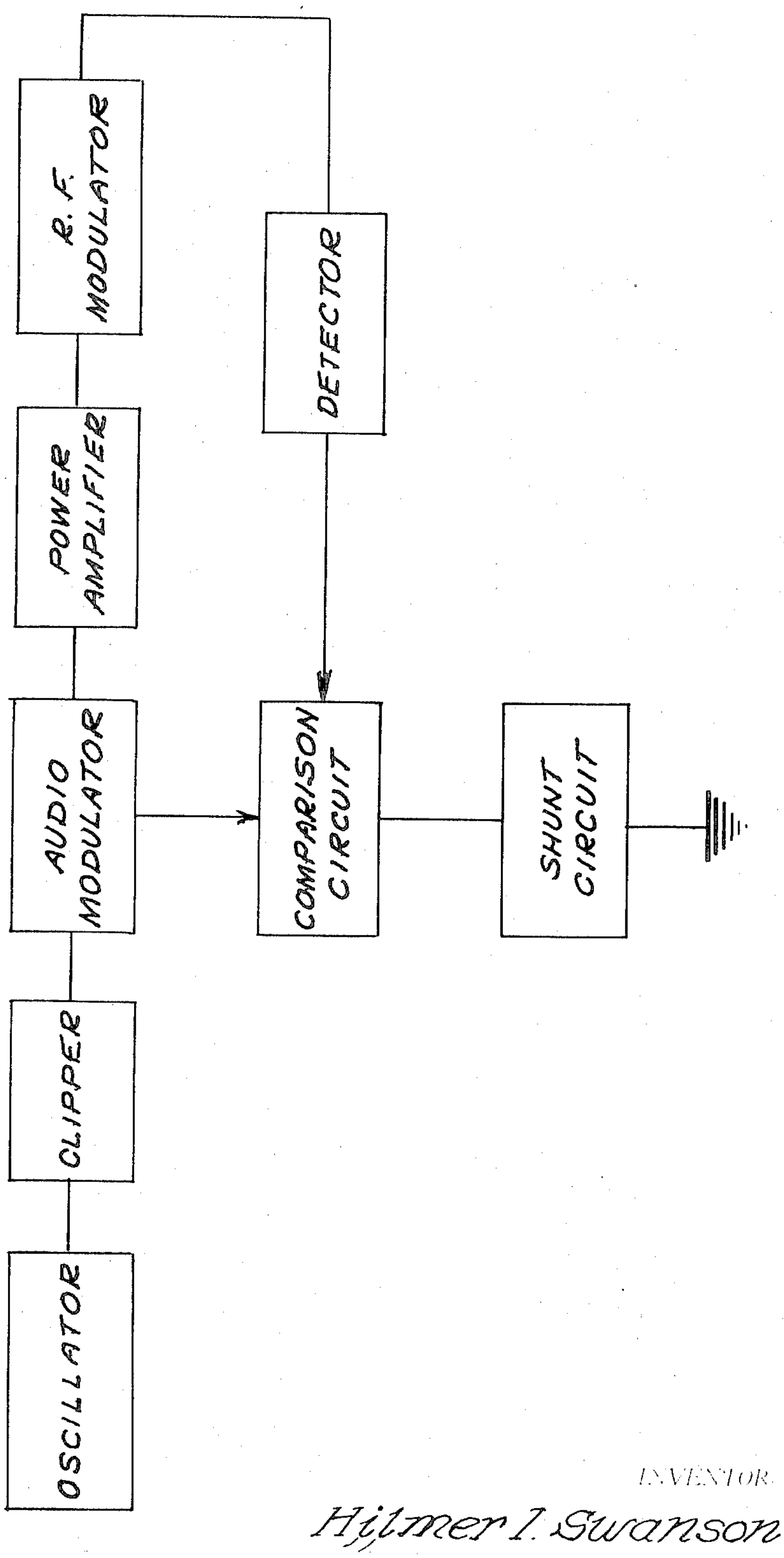
FIG. 8 is a block diagram of the circuit shown in the preceding figures.

Further along the lines indicated above, means may be provided in the transmitter circuit for sensing the presence of an arc in the power amplifier, for instance, or in the circuit damper tube. FIG. 6 illustrates the functioning of a circuit for utilizing the features of the present invention to protect the output power stages from such arcing. In particular, portions of the circuit shown in FIG. 6 are identical to portions of the circuit shown in FIG. 3, and, accordingly, reference numerals have been carried over to FIG. 6. Specifically, a power amplifier 139 is coupled to an arc sensor 140 which may be any of a variety of means for sensing the presence of an arc as is well known in the art. The arc sensor then controls the gate of an SCR which is also well known in the art, the SCR being identified by the reference numeral 40. The anode to cathode of the SCR is connected in series with a circuit line 142 which is connected to ground at a junction point 143. Accordingly, the presence of an arc will be sensed by the sensor 140 to trigger " on" the SCR 141 which in turn will short circuit the base 65 of the transistor 66 to ground at the junction point 143. Such short circuiting will then cut the power to the output stages as indicated in FIG. 2 and as described in connection with the above-described embodiments of the present invention.

In a similar manner, a VSWR sensor such as a sensor 144 may be connected to a threshold trigger circuit 145 which may be any circuit which triggers into an "on" state when a given voltage input reaches a predetermined level. The triggering "on" of the trigger circuit 145 then actuates a relay 146 to throw a switch 147 and couple the circuit line 148 to ground at a circuit junction point 149. The line 148 is similar to the line 142 and is coupled like the line 142 to a circuit junction point 150 at the base 65 of the transistor 66 for shorting the same to ground and cutting off the power supply to the output power stages.

It will be apparent that various modifications and combinations of the features of my invention may be accomplished by those skilled in the art, but I desire to claim all such modifications and combinations as properly come within the spirit and scope of my invention.

I claim:

1. A high-power radiofrequency transmitter comprising:

input means for receiving an audio related signal, means for pulse duration modulating said audio signal amplifier means for increasing the magnitude of said audio related signal, pulse duration modulated signal, said amplifier means including a low-level amplifier and a power amplifier, a radiofrequency modulator, said power amplifier means and said radiofrequency modulator being connected to form a series circuit, means for sensing the transmitter output power and for developing a low-level control signal in response thereto, and a comparator means for applying said control signal to the comparator, said comparator comparing the control signal with a signal from the low-level amplifier input whereby to substantially cut off the power delivery to the power amplifier and RF modulator due to overload condition.

2. A radiofrequency transmitter comprising:

input means for receiving an audio related signal, means for pulse duration modulating said audio signal, amplifier means for increasing the magnitude of said pulse duration modulated signal, said amplifier means including a low-level amplifier and a power amplifier, a radiofrequency modulator, said power amplifier means and said radiofrequency modulator being connected to form a series circuit, means for sensing the transmitter output power and for developing a low-level control signal in response thereto, means for applying said control signal to a low-level circuit point in said amplifier means to control the power output of said power amplifier and radiofrequency modulator, means for sensing the transmitter power input and means for comparing the sensed power levels, said means for sensing the power output comprising a detector, means for coupling the transmitter output RF signal to said detector for developing a DC signal indicative of the level of the transmitter output power, a dissipation control element, means for coupling said DC signal to said dissipation control element, means for coupling said sensed power input signal to said dissipation control element, and means for causing said dissipation control element to be triggered to develop said control signal when the transmitter output power as indicated by said DC signal falls below a specified dissipation level with respect to the input power as indicated by said sensed power input signal 3. A radiofrequency transmitter in accordance with claim 2 wherein said dissipation control element comprises a diode and wherein said DC signal and said sensed power input signal are coupled to one terminal of said diode and wherein calibration means are provided to maintain said diode in a nonconducting state when the difference between the input and output power levels falls within a predetermined permissible dissipation level.

4. A radiofrequency transmitter in accordance with claim 3 wherein said amplifier means includes a threshold amplifier and a power amplifier, said threshold amplifier controlling the operation of said power amplifier and radiofrequency modulator, wherein the anode of said diode is coupled to the input of said threshold amplifier, and wherein the cathode of said diode is coupled to a low voltage circuit point such that the triggering of said diode effectively shorts a portion of the power input to said threshold amplifier thereby reducing the power gain throughout the entire subsequent serially connected power amplifier and radiofrequency modulator.

5. A radiofrequency transmitter in accordance with claim 3 wherein said calibration means includes means for varying the magnitude of said DC signal to be less than and opposite in polarity from said sensed power input signal when said dissipation level is within permissible limits.

6. A radiofrequency transmitter comprising:

input means for receiving an audio signal from an audio source;

pulse duration modulator means connected to said input means for pulse duration modulating the audio signal;

a low-level threshold amplifier means coupled to said pulse duration modulator means for initially increasing the magnitude of the pulse duration modulated signal;

power amplifier coupled to said threshold amplifier means for substantially increasing the magnitude of the pulse duration modulated signal, demodulation means coupled to the power amplifier for demodulating the amplified pulse duration modulated signal;

a radiofrequency modulator means connection means for applying the amplified demodulated audio signal to the radio frequency modulator means for said power amplifier and radiofrequency modulator means being serially connected means for sensing an excessive power level condition in the series circuit which includes the power amplifier and the RF modulator, means responsive to said sensed circuit condition for developing a low-level corrective signal, and means for applying said corrective signal to a control element in said low-level threshold amplifier whereby to substantially cut off the power delivery to the power amplifier and RF modulator due to overload condition.

7. A radiofrequency transmitter in accordance with claim 6 wherein said threshold amplifier includes an initial transistor and wherein said means for applying said corrective signal to a control element comprises means for applying said corrective signal to the base of said initial transistor.

8. A radiofrequency transmitter in accordance with claim 7 wherein said means responsive to said sensed circuit condition for developing a corrective signal comprises an electronic switching device coupled between a low voltage circuit point and the base of said transistor whereby the turning "on" of said switching device shorts out a portion of the input power being applied to the base of said initial transistor.

9. A radiofrequency transmitter in accordance with claim 8 wherein said means for sensing an unwanted condition includes means for sensing input power and means for sensing output RF power, means for deriving calibrated DC signals of opposing polarities which are indicative of said sensed powers respectively and means for algebraically adding said DC signal and for applying the net signal thereof to said electronic switching device.

10. A radiofrequency transmitter comprising a pulse duration modulator, a low-level audio modulator amplifier coupled to said PDM, power amplifier, and an RF power modulator, said power amplifier being connected in series with said RF power modulator said power amplifier also being coupled to the output of said low-level audio modulator, means for developing a low-level control signal when the power dissipation of the series circuit, which includes the power amplifier and the RF modulator, exceeds a desired level, and means for applying said low-level control signal to the low-level audio modulator amplifier to substantially cutoff the power delivery to the RF power modulator due to overload condition.

11. A radiofrequency transmitter in accordance with claim 1 wherein said means for sensing a predetermined circuit condition comprises means for sensing the magnitude of the RF carrier signal.

12. A radiofrequency transmitter in accordance with claim 11 wherein said means includes negative feedback, rectification, and calibration means respectively, such that the output of said calibration means is a DC signal indicative of the carrier level.

13. A radiofrequency transmitter in accordance with claim 1 wherein said means for sensing a predetermined circuit condition comprises a VSWR sensor, and a threshold trigger circuit coupled to the output of said VSWR sensor and wherein said means responsive to said sensed circuit condition comprises means which are responsive to the triggering of said threshold trigger circuit.

14. A radiofrequency transmitter in accordance with claim 12 wherein said means for applying said control signal to the input of said amplifier means comprises means responsive to the triggering of said threshold trigger circuit to short circuit the input of said amplifier means.

15. A radiofrequency transmitter in accordance with claim 1 wherein said means for sensing a predetermined circuit condition comprises means for sensing the presence of an unwanted arc in said series circuit and wherein said means for developing a control signal include an electronic switching means which is responsive to the presence of a sensed arc to substantially short circuit the input of said amplifier means.

* * * * *